(12) United States Patent
Huang et al.

(10) Patent No.: US 12,415,417 B2
(45) Date of Patent: Sep. 16, 2025

(54) THREE-DIMENSIONAL TOUCH DEVICE AND MANUFACTURING METHOD THEREOF

(71) Applicant: DARWIN PRECISIONS CORPORATION, Hsinchu County (TW)

(72) Inventors: Chia Tsun Huang, Hsinchu County (TW); Hsuan Yao, Hsinchu County (TW); Chun-Ling Huang, Hsinchu County (TW); Chia-Hung Liu, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 203 days.

(21) Appl. No.: 18/379,175

(22) Filed: Oct. 12, 2023

(65) Prior Publication Data

US 2024/0336135 A1 Oct. 10, 2024

(30) Foreign Application Priority Data

Apr. 10, 2023 (TW) .................................. 112113311

(51) Int. Cl.
| | |
|---|---|
| *H05K 1/18* | (2006.01) |
| *B60K 35/00* | (2006.01) |
| *B60K 35/10* | (2024.01) |
| *B60K 35/60* | (2024.01) |

(52) U.S. Cl.
CPC ............ *B60K 35/00* (2013.01); *H05K 1/189* (2013.01); *B60K 35/10* (2024.01); *B60K 35/60* (2024.01); *B60K 2360/1446* (2024.01); *B60K 2360/782* (2024.01)

(58) Field of Classification Search
CPC .............................. G06F 3/041; G06F 3/0445
See application file for complete search history.

(56) References Cited

U.S. PATENT DOCUMENTS

| | | | |
|---|---|---|---|
| 10,768,726 B2 | 9/2020 | Lin et al. | |
| 11,334,186 B1* | 5/2022 | Tsai | ........................ G06F 3/042 |
| 2012/0032916 A1* | 2/2012 | Enoki | ..................... G06F 3/044 |
| | | | 29/829 |

FOREIGN PATENT DOCUMENTS

| | | |
|---|---|---|
| CN | 114564128 A | 5/2022 |
| TW | 579186 U | 3/2004 |

* cited by examiner

*Primary Examiner* — Kevin M Nguyen

(57) ABSTRACT

A three-dimensional touch device includes a flexible circuit board structure and an in-mold formed film. The flexible circuit board structure includes a flexible circuit substrate and touch electrodes disposed on the outer surface of the flexible circuit substrate. The flexible circuit substrate includes folded lines. At least two of the folded lines are not parallel to each other. A contour of the flexible circuit structure is formed by bending the flexible circuit substrate and is suitable for having a main body portion and bending portions. The bending portions are connected to the main body portion through the folded lines. The in-mold formed film encapsulates the inner surface, the outer surface and the touch electrodes. The in-mold formed film includes an exterior film layer covering the outer surface and the touch electrodes. The contour of the flexible circuit structure approaches to a part of contour of the exterior film layer.

20 Claims, 9 Drawing Sheets

THREE-DIMENSIONAL TOUCH DEVICE AND MANUFACTURING METHOD THEREOF

FIELD OF THE INVENTION

The present invention relates to a touch device, and particularly relates to a three-dimensional touch device with a high touch sensitivity and a manufacturing method thereof.

BACKGROUND OF THE INVENTION

Compared with conventional physical keys, the touch device is more conveniently used. Fingers of a user can directly slide on the touch device to input various operating instructions. Therefore, the touch device has been widely applied to various electronic devices, for example mobile electronic devices such as mobile phones, digital cameras and tablet personal computers.

At present, common touch devices, for example, products such as touch keys or key indicating lamps, realize their touch function as touch circuit boards are flatly attached to the inner sides of outer shells of the products. However, such products where the touch circuit boards are flatly attached to the inner sides of outer shells of the products are mostly of planar structures or simple 2D curved surfaces in appearance. Once the exterior structures of the products have 3D curved surface structures, the touch function cannot be realized by way of flatly attaching the touch circuit boards to the inner sides of the outer shells of the products.

SUMMARY OF THE INVENTION

The present invention provides a three-dimensional touch device and a manufacturing method thereof. The three-dimensional touch device can realize appearance modeling of a product with a 3D flexible printed circuit board (FPC) structure approaching to a complex curved surface, so that the three-dimensional touch device features better touch sensitivity.

The three-dimensional touch device provided by the present invention includes a first flexible circuit board structure and an in-mold formed film. The first flexible circuit board structure includes a first flexible circuit substrate and a first touch electrode. The first flexible circuit substrate is provided with an outer surface and an inner surface opposite to each other. The first touch electrode is disposed on the outer surface. The first flexible circuit substrate includes a plurality of folded lines. At least two of the folded lines are not parallel to each other. A contour of the first flexible circuit structure is formed by bending the first flexible circuit substrate and the first flexible circuit substrate is suitable for having a main body portion and a plurality of bending portions. The bending portions are connected to the main body portion through the folded lines. The in-mold formed film encapsulates the inner surface, the outer surface and the first touch electrode. The in-mold formed film includes an exterior film layer covering the outer surface and the first touch electrode. The contour of the first flexible circuit structure approaches to a first-part contour of the exterior film layer.

In an embodiment of the present invention, a through hole is formed in the first flexible circuit substrate; the in-mold formed film further includes an interior film layer and a reinforcing column; the interior film layer, the interior film layer covers the inner surface, and the reinforcing column fills the through hole and is connected to the exterior film layer and the interior film layer.

In an embodiment of the present invention, the three-dimensional touch device further includes a second flexible circuit substrate structure spliced together with the first flexible circuit substrate structure, wherein the contour of the second flexible circuit substrate structure approaches to a second-part contour of the exterior film layer.

In an embodiment of the present invention, the second flexible circuit substrate structure includes a second flexible circuit substrate and a second touch electrode; the second touch electrode is disposed on the second flexible circuit substrate; and the second touch electrode is electrically connected to at least one of the touch electrodes.

In an embodiment of the present invention, the second flexible circuit substrate is spliced with the first flexible circuit substrate in a snap-fit manner.

In an embodiment of the present invention, the main body portion of the first flexible circuit substrate structure is provided with a plurality of edges, the bending portions extend respectively from the edges, and the edges are respectively taken as the folded lines.

In an embodiment of the present invention, the exterior film layer is provided with a curved surface, a sub folded line is formed on each of the bending portions, and each of the bending portions is bent along the sub folded line to be suitable for approaching to the curved surface.

In an embodiment of the present invention, the three-dimensional touch device is a spherical touch key, wherein the exterior film layer is of a semispherical shell structure provided with a peripheral portion and a top portion; the main body portion faces the top portion in a plate-like manner; the bending portions are stripe-like; each of the bending portions is bent along the sub folded line to be divided into a plurality of sub regions; and the plurality of two sub regions are suitable for approaching to the peripheral portion.

In an embodiment of the present invention, the first touch electrodes are respectively disposed on each of the sub regions and the main body portion.

In an embodiment of the present invention, the three-dimensional touch device further includes a second flexible circuit substrate structure spliced together with the main body portion, wherein the contour of the second flexible circuit substrate structure approaches to the contour of the top portion.

In an embodiment of the present invention, the second flexible circuit substrate structure includes a second flexible circuit substrate and a second touch electrode; the second touch electrode is disposed on the second flexible circuit substrate; the second flexible circuit substrate is bent in a conical shape; and a bottom edge of the conical shape is spliced to the main body portion.

In an embodiment of the present invention, an open slot and snap-fit holes are formed in the main body portion, and the second flexible circuit substrate is provided with snap-fit structures suitable for being fastened with the snap-fit holes, respectively.

A manufacturing method of a three-dimensional touch device provided by the present invention includes: providing a first flexible circuit board structure, including a first flexible circuit substrate and a first touch electrodes, wherein the first flexible circuit substrate is provided with an outer surface and an inner surface opposite to each other; the first touch electrode is disposed on the outer surface; the first flexible circuit substrate includes a plurality of folded lines, and at least two of the folded lines are not parallel to each other; a contour of the first flexible circuit structure is formed by bending the first flexible circuit substrate, and the first flexible circuit substrate is suitable for having a main body portion and a plurality of bending portions; each of the bending portions is connected to the main body portion through each of the folded lines; placing the first flexible circuit board structure in a first mold cavity for a first injection process to form an interior film layer covering the inner surface; and placing the first flexible circuit board structure covered by the interior film layer in a second mold cavity for a second injection progress to form an exterior film layer covering the outer surface and the first touch electrode, wherein the contour of the first flexible circuit structure approaches to a first-part contour of the exterior film layer.

In an embodiment of the present invention, a through hole is formed in the first flexible circuit substrate, and during the first injection process, a part of the interior film layer fills the through hole as a reinforcing column. In an embodiment of the present invention, the interior film layer is connected to the reinforcing column.

In an embodiment of the present invention, the manufacturing method of a three-dimensional touch device further includes: providing a second flexible circuit substrate structure and splicing the second flexible circuit substrate structure together with the first flexible circuit substrate structure in a snap-fit manner, wherein the contour of the second flexible circuit substrate structure approaches to a second-part contour of the exterior film layer.

In an embodiment of the present invention, the manufacturing method of a three-dimensional touch device further includes a welding process of welding the first flexible circuit substrate structure and the second flexible circuit substrate structure spliced together.

In an embodiment of the present invention, the main body portion of the first flexible circuit substrate structure is provided with a plurality of edges, the bending portions extend respectively from the edges, and the edges are respectively taken as the folded lines.

In an embodiment of the present invention, the exterior film layer is provided with a curved surface, a sub folded line is formed on each of the bending portions, and each of the bending portions is bent along the sub folded line to be suitable for approaching to the curved surface.

In an embodiment of the present invention, a same plastic is used in the first injection process and the second injection process.

Appearance modeling of the product with the 3D flexible circuit board structure approaching to the curved surface is realized by bending the flexible circuit substrate, and selectively assisted by splicing the plurality of flexible circuit substrates, appearance modeling of the product with the 3D flexible circuit board structure approaching to the curved surface is realized, so that the modeling design is more free and elastic. Furthermore, besides realizing the product appearance of a three-dimensional 3D model to gain the effects of modeling aesthetics and ergonomics by matching the 3D flexible circuit board structure with the in-mold injection molding technique, the manufacturing method of the three-dimensional touch device provided by the embodiment of the present invention enables the three-dimensional touch device to have the better touch sensitivity as the touch electrode can extremely approach to the exterior surface of the product.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
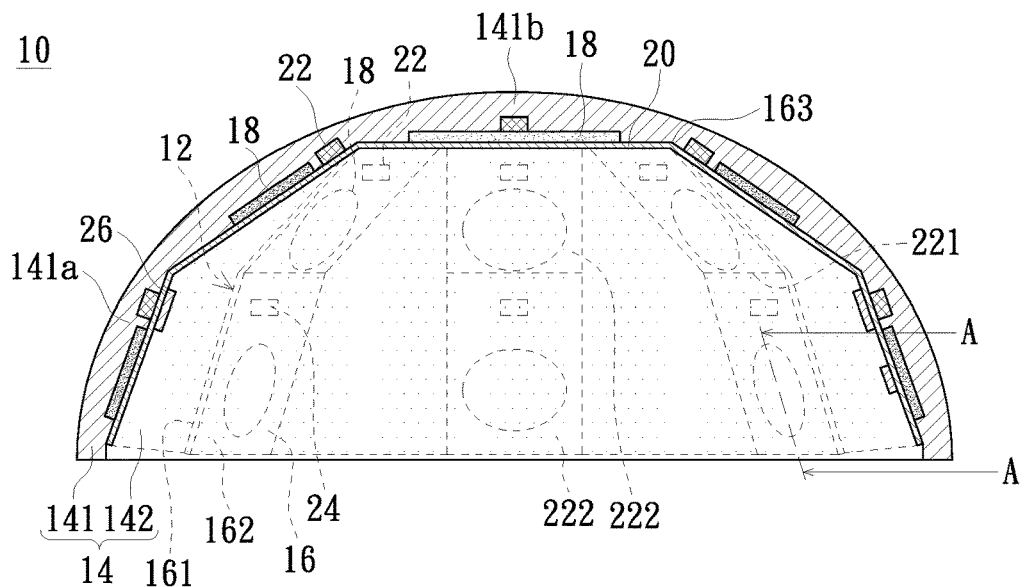
FIG. 1 is a schematic cross-sectional view of a three-dimensional touch device in a first embodiment of the present invention.
Figure 2:
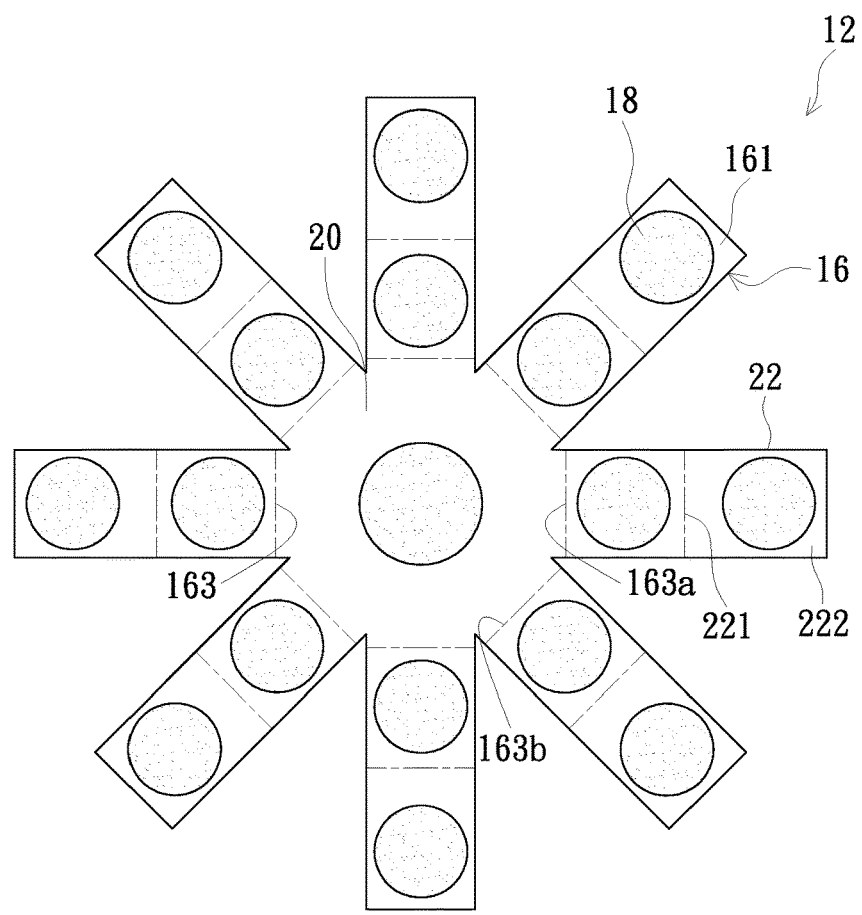
FIG. 2 is an expanded planar schematic diagram of a first flexible circuit board structure in the first embodiment of the present invention.

FIG. 1 is a schematic cross-sectional view of a three-dimensional touch device in a first embodiment of the present invention. As shown in FIG. 1, the three-dimensional touch device 10 includes a first flexible circuit board structure 12 and an in-mold formed film 14. The first flexible circuit board structure 12 includes a first flexible circuit substrate 16 and first touch electrodes 18. The first flexible circuit substrate 16 is provided with an outer surface 161 and an inner surface 162 opposite to each other. The first touch electrode 18 is disposed on the outer surface 161. In an embodiment, an electronic assembly such as an LED assembly 22, a micro-controller 26 and a conducting circuit (not shown in the figure) can also be disposed on the first flexible circuit substrate 16. A contour of the first flexible circuit structure 12 is formed by bending the first flexible circuit substrate 16. FIG. 2 is an expanded planar schematic diagram of a first flexible circuit board structure in the first embodiment of the present invention. The electronic assembly is not drawn. As shown in FIG. 1 and FIG. 2, the first flexible circuit substrate 16 includes a plurality of folded lines 163. At least two of the folded lines 163 (such as folded lines 163a and 163b) are not parallel to each other. The first flexible circuit substrate 16 is bent along the folded lines 163, and the first flexible circuit substrate 12 is suitable for having a main body portion 20 and a plurality of bending portions 22. The bending portions 22 are connected to the main body portion 20 through the folded lines 163. In an embodiment, the first touch electrodes 18, for example, are disposed on the main body portion 20 and the bending portions 22.

As described above, as shown in FIG. 1, the in-mold formed film 14 encapsulates the inner surface 161 and the outer surface 162 of the first flexible circuit substrate 16 and the first touch electrodes 18; in an embodiment not drawn, a part of the first flexible circuit substrate 16 is exposed out of the in-mold formed film 14 so as to be electrically connected to an external electronic device. The in-mold formed film 14 includes an exterior film layer 141 covering the outer surface 161 and the first touch electrodes 18, wherein the contour of the first flexible circuit substrate 12 approaches to the first portion of contour of the exterior film layer 141. In other words, for example, the curved surface contour of the exterior film layer 141 determines the curved surface appearance of the product using the three-dimensional touch device 10. The first flexible circuit substrate 16 approaches to the shape of the curved surface appearance of the product by way of bending, so that the outer surface 161 of the first flexible circuit substrate 16 and the first touch electrode 18 thereon extremely approach to the curved surface appearance of the product, thereby facilitating achievement of the touch function.

Figure 3:
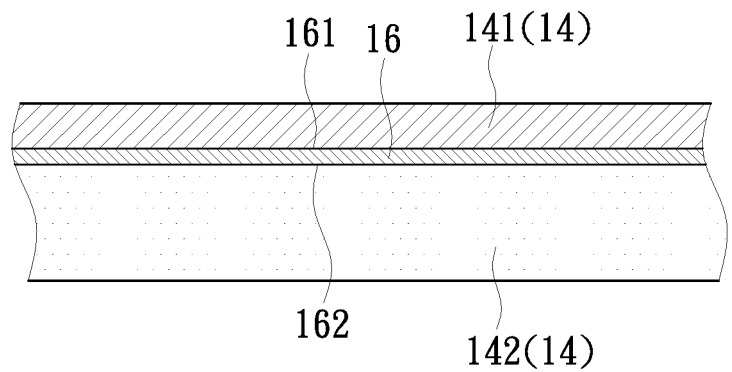
FIG. 3 is a schematic cross-sectional view along line segment AA in FIG. 1.

FIG. 3 is a schematic cross-sectional view along line segment AA in FIG. 1. The in-mold formed film 14 further includes an interior film layer 142 covering the inner surface 162 of the first flexible circuit substrate 16. In an embodiment, the interior film layer 142 and the exterior film layer 141 are made from the same material. The interior film layer 142 can be different from the exterior film layer 141 in terms of thickness. The interior film layer 142 cannot be limited to along the curved surface appearance of the product. Holes or trenches can be reserved in the interior film layer 142 for integrating with other assemblies or devices of the product subsequently.

Figure 4:
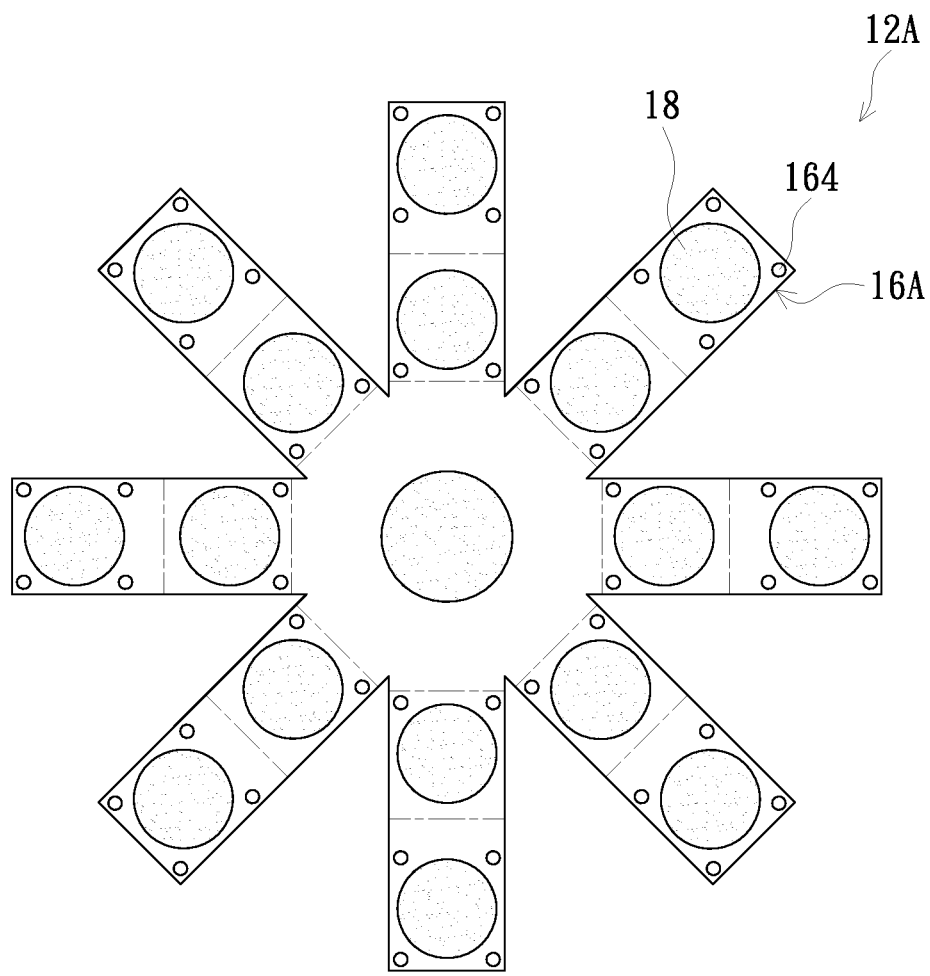
FIG. 4 is an expanded planar schematic diagram of a first flexible circuit board structure in a second embodiment of the present invention.
Figure 5:
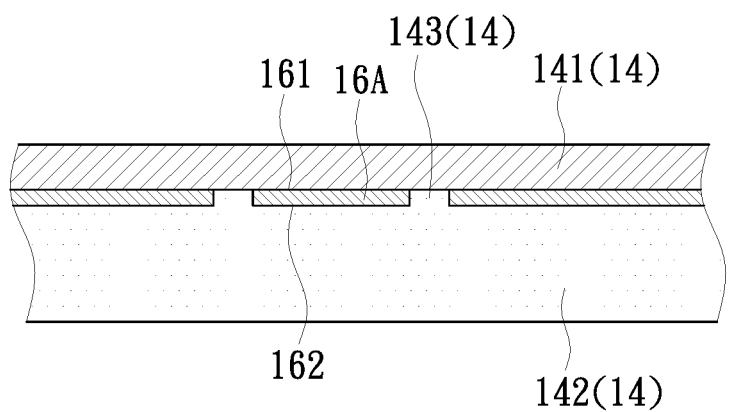
FIG. 5 is a partial schematic cross-sectional view of the three-dimensional touch device in the second embodiment of the present invention.

FIG. 4 is an expanded planar schematic diagram of a first flexible circuit board structure in a second embodiment of the present invention. FIG. 5 is a partial schematic cross-sectional view of the three-dimensional touch device in the second embodiment of the present invention. As shown in FIG. 4, the major difference between the first flexible circuit board structure 12A and the first flexible circuit board structure 12 shown in the first embodiment lies in that through holes 164 are formed in the first flexible circuit substrate 16A and are dispersed among the first touch electrodes 18. As shown in FIG. 5, when the in-mold formed film 14 encapsulates the upper surface 161 and the lower surface 162 of the first flexible circuit substrate 16A, the in-mold formed film 14 is provided with the exterior film layer 141, the interior film layer 142 and reinforcing columns 143, wherein each of the reinforcing columns 143 fills each of the through holes 164 (marked in FIG. 4) and connects the exterior film layer 141 located on the outer surface 161 and the interior film layer 142 located on the inner surface 162. The pore diameter of the through hole 164 is, for example, over 1 mm, and the area of the through hole 164 is, for example, over 0.8 mm$^2$. By means of the design that the reinforcing column 143 fills the through hole 164, the bonding strength between the exterior film layer 141 and the interior film layer 142 is enhanced, so that the integral structural strength of the three-dimensional touch device 10 is improved.

As further shown in FIG. 1, the three-dimensional touch device 10 takes a spherical touch key as an example. The exterior film layer 141 is of a semispherical shell structure by default and is provided with a curved peripheral portion 141a and a curved top portion 142b; for the first flexible circuit board structure 12, to further approach to the curved surface of the exterior film layer 14 so as to provide better touch sensitivity of the three-dimensional touch device 10, a sub folded line 221 is formed on each of the bending portions 22, and each of the bending portions 22 is bent along the sub folded line 221 to be suitable for approaching to the curved surface. In an embodiment, as shown in FIG. 2 meanwhile, the main body portion 20 of the first flexible circuit board structure 12 is plate-like. Preferably, the main body portion 20 is in a regular polygon shape, for example a regular octagon shape; each of the bending portions 22 is stripe-like after being unfolded, the quantity of the bending portions 22, for example, corresponds to the quantity of edges of the main body portion 20, and each of the bending portions 22 is connected to each of the edges of the main body portion 20 through each of the folded lines 163. Furthermore, each of the bending portions 22 can be divided into, for example, two sub regions 222 through the sub folded line 221. It can be understood that the greater the quantity of the bent sub regions 222 is, the more probability of approaching to the curved surface of the exterior film layer 141 is. As shown in FIG. 1, in the three-dimensional touch device 10 (the spherical touch key), the main body portion 20, for example, faces the top portion 141b of the exterior film layer 141, and the sub region 222 of each of the bending portions 22, for example, approaches to the peripheral portion 141a. In an embodiment, the plurality of first touch electrodes 18 are respectively disposed on each of the sub regions 222 and the main body portion 20.

Furthermore, it is highly difficult to intactly approach to the exterior film layer 141 with the complex appearance modeling by the first flexible circuit board structure 12 formed by bending the single first flexible circuit substrate 16. Therefore, in an embodiment of the present invention, a plurality of flexible circuit substrates are respectively bent to form the flexible circuit board structures with default shape, and the plurality of flexible circuit board structures are spliced. Circuit connection between the flexible circuit board structures can be abutting joint by a connector, snap-fit connection and/or connection by direct butt welding of welding spots. By splicing the flexible circuit board structures, the 3D curved surface with the complex appearance modeling can be achieved, which is beneficial to approaching to the contour of the exterior film layer when it is put in the mold cavity for injection molding of the exterior film layer.

Figure 6:
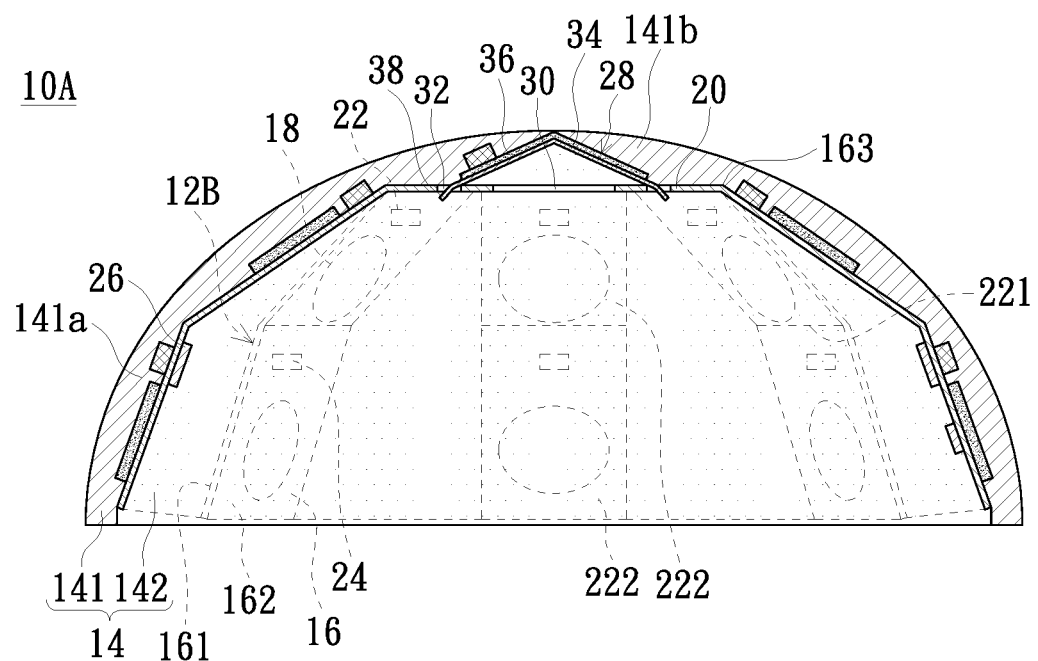
FIG. 6 is a schematic cross-sectional view of the three-dimensional touch device in a third embodiment of the present invention.

FIG. 6 is a schematic cross-sectional view of the three-dimensional touch device in a third embodiment of the present invention. As shown in FIG. 6, the three-dimensional touch device 10A also takes the spherical touch key as an example. The three-dimensional touch device 10A includes the first flexible circuit board structure 12B, the second flexible circuit board structure 28 and the in-mold formed film 14, wherein the exterior film layer 141 of the in-mold formed film 14 is of the semispherical shell structure by default and is provided with the curved peripheral portion 141a and the curved top portion 141b. As shown in FIG. 6, the bent contour of the bending portion 22 of the first flexible circuit board structure 12B approaches to the first portion of contour of the exterior film layer 14, for example, the contour of the curved peripheral portion 141a. For example, the main body portion 20 and the curved top portion 141b of the first flexible circuit board structure 12B can be spliced into the second flexible circuit board structure 28. The contour of the second flexible circuit board structure 28 approaches to the second portion of contour of the exterior film layer 141, for example, the contour of the curved top portion 141b.

Figure 7A:
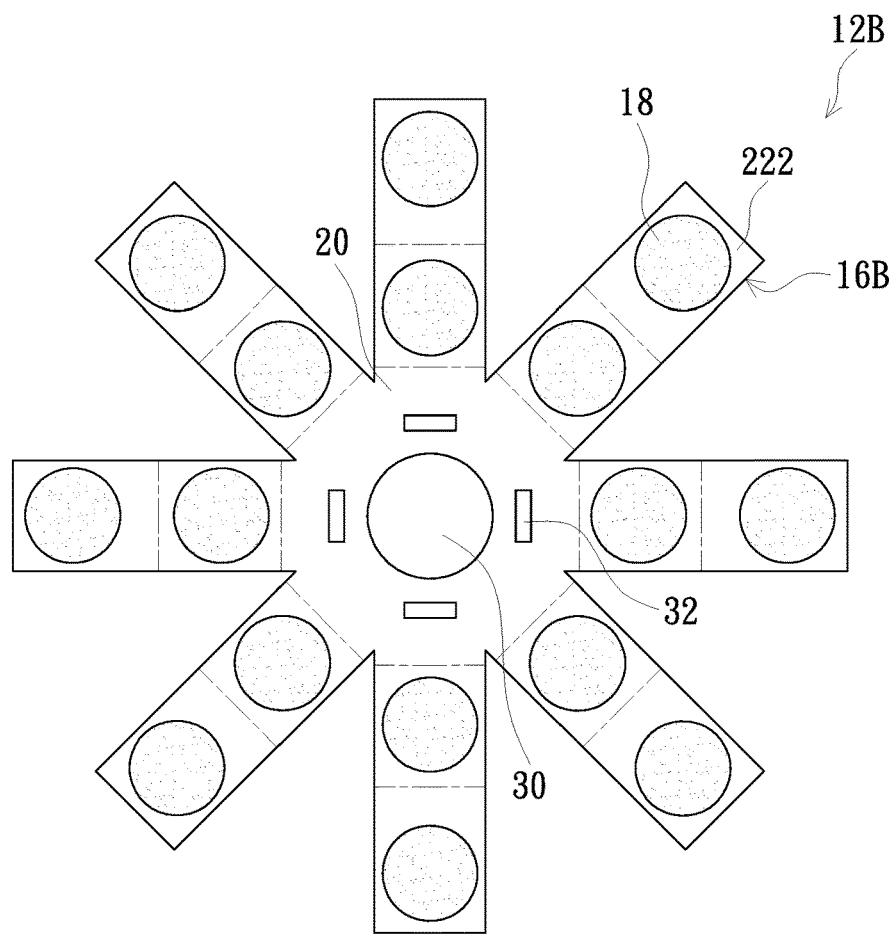
FIG. 7A and FIG. 7B are expanded planar schematic diagrams of the first flexible circuit board structure and the second flexible circuit board structure in the third embodiment of the present invention.
Figure 7B:
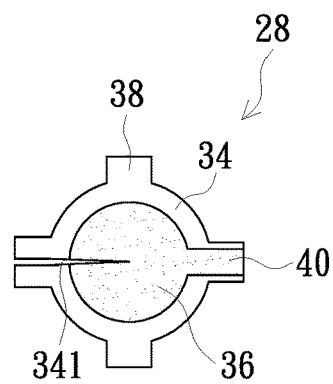

As described above, FIG. 7A and FIG. 7B are expanded planar schematic diagrams of the first flexible circuit board structure and the second flexible circuit board structure in the third embodiment of the present invention. The electronic assembly is not drawn. As shown in FIG. 7A, the major difference between the first flexible circuit board structure 12B and the first flexible circuit board structure 12 shown in the first embodiment lies in that an open slot 30 and a plurality of snap-fit holes 32 are formed in the main body portion 20, and the first touch electrodes 18 all are disposed on the sub regions 222 rather than the main body portion 20. Furthermore, as shown in FIG. 7B, the second flexible circuit board structure 28 includes the second flexible circuit substrate 34 and the second touch electrode 36. The second touch electrode 36 is disposed on the second flexible circuit substrate 34. The contour of the first flexible circuit board structure 12B is formed by bending the first flexible circuit substrate 16B, and the contour of the second flexible circuit board structure 28 is formed by bending the second flexible circuit substrate 34. As shown in FIG. 6, the second flexible circuit board structure 28 and the first flexible circuit board structure 12B are spliced, and the second touch electrode 36 is electrically connected to one of the first touch electrodes 18.

In an embodiment, as shown in FIG. 6, FIG. 7A and FIG. 7B, the second flexible circuit substrate 34, for example, is in a round plate shape with a groove 341. The round plate-like periphery, for example, is provided with a plurality of snap-fit structures 38. The second flexible circuit substrate 34 can be bent in a conical shape, and the plurality of snap-fit structures 38 are suitable for being distributed at the bottom edge of the conical shape; the second flexible circuit board structure 28 is disposed on the main body portion 20 of the first flexible circuit board structure 12B and is in snap-fit with the plurality of snap-fit holes 32 of the main body portion 20 by means of the plurality of snap-fit structures 38, so that the second flexible circuit board structure 28 and the first flexible circuit board structure 12B are spliced. The contour of the 3D flexible circuit board structure formed by splicing the first flexible circuit board structure 12B and the second flexible circuit board structure 28 can further approach to the exterior film layer 14 of the semispherical shell structure. In an embodiment, welding spots can further be disposed at spliced joints to enhance the bonding strength between the first flexible circuit board structure 12B and the second flexible circuit board structure 28 by way of direct butt welding.

In an embodiment, the second flexible circuit substrate 34 can further be provided with a conducting circuit 40. A part of the conducting circuit 40, for example, can be disposed along one of the snap-fit structures 38 and is in snap-fit with the snap-fit hole 32 by means of the snap-fit structure 38, so that the conducting circuit 40 is electrically connected to the first flexible circuit board structure 12B. Furthermore, in addition to covering the inner surface 161 of the first flexible circuit substrate 16, the interior film layer 142 of the in-mold formed film 14 further fills the open slot 30 of the main body portion 20 and covers the inner surface of the second flexible circuit substrate 34.

Figure 8:
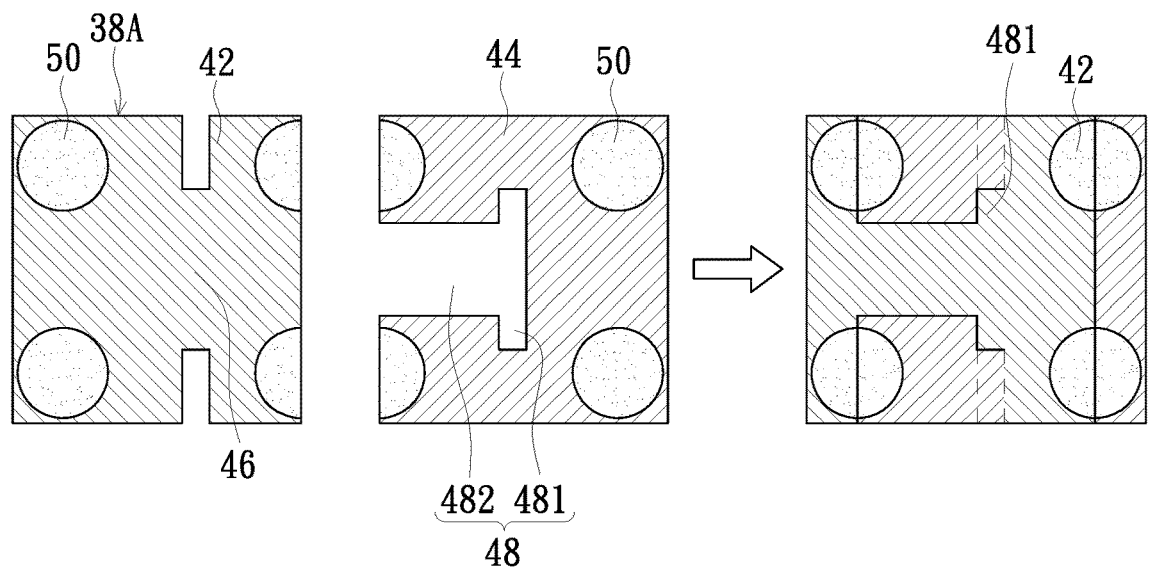
FIG. 8 is an application schematic diagram of a snap-fit structure and a snap-fit hole in an embodiment.

FIG. 8 is an application schematic diagram of a snap-fit structure and a snap-fit hole in an embodiment. The snap-fit structure 38A, for example, is such that a necking portion 46 is formed on a portion 42 to be connected of the flexible circuit substrate. The snap-fit hole 48 is further formed in a portion 44 to be connected of another flexible circuit substrate. The snap-fit hole 48, for example, is a T-shaped groove, and is provided with a wide groove 481 and a narrow groove 482 communicated with each other. The width of the necking portion 46, for example, corresponds to the width of the wide groove 481, and the portion 42 to be connected and the portion 44 to be connected of the two flexible circuit substrates are overlaid and spliced together by sticking the necking portion 46 into the wide groove 481. Further, in an embodiment, a plurality of welding spots 50 can be further disposed at the overlaid joint, so that the bonding strength between the portion 42 to be connected and the portion 44 to be connected is enhanced by direct butt welding of the welding spots 50. Furthermore, the implementing patterns of the snap-fit structure 38A and the snap-fit hole 48 are not limited hereto. Specifically speaking, by disposing the snap-fit structure 38A and the snap-fit hole 48, the two flexible circuit substrates bent to pre-set contour are spliced and snapped first and are prevented from rebounding, thereby facilitating a subsequent welding process.

Figure 9:
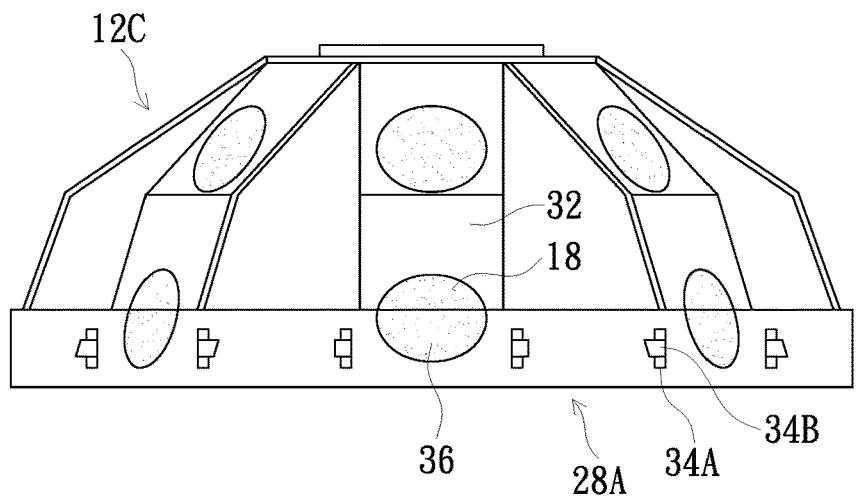
FIG. 9 is a lateral schematic diagram of the first flexible circuit board structure and the second flexible circuit board structure in a fourth embodiment of the present invention.
Figure 10A:
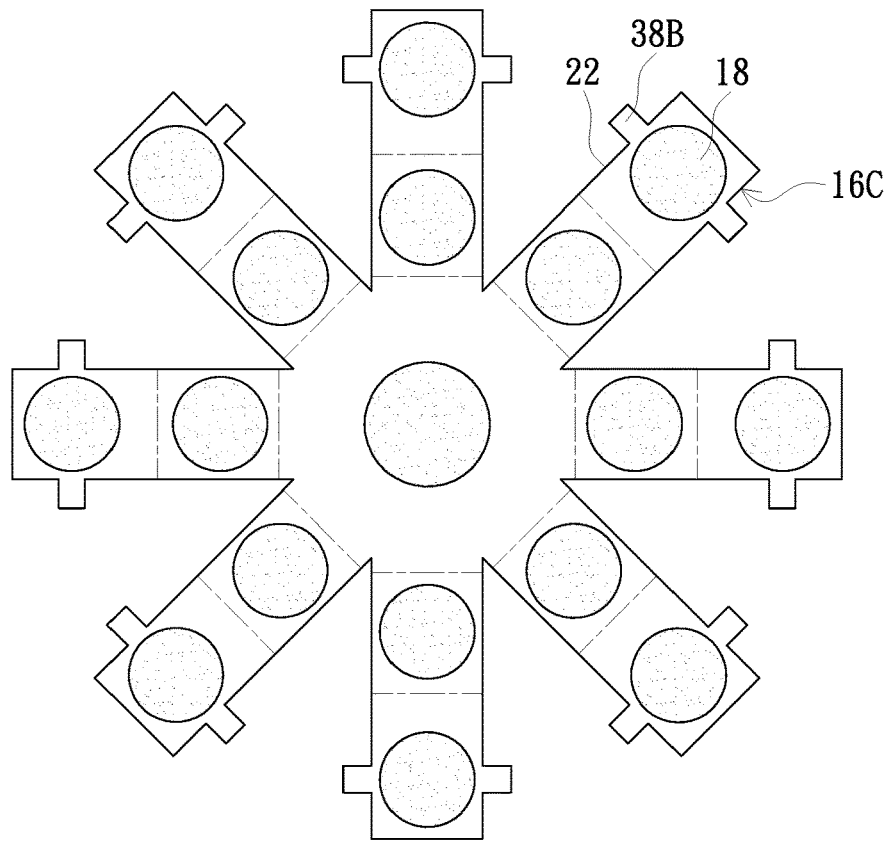
FIG. 10A and FIG. 10B are expanded planar schematic diagrams of the first flexible circuit board structure and the second flexible circuit board structure in the fourth embodiment of the present invention.
Figure 10B:
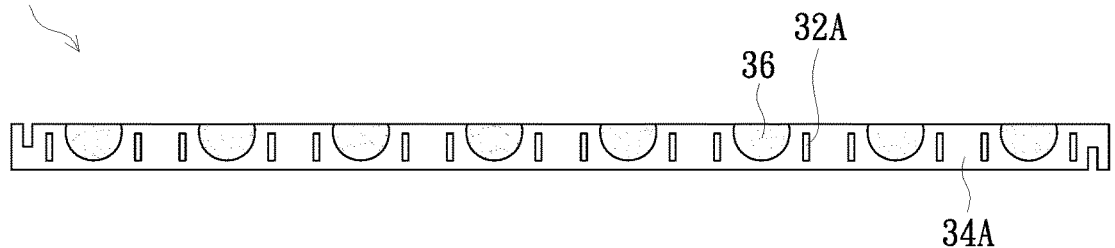

FIG. 9 is a lateral schematic diagram of the first flexible circuit board structure and the second flexible circuit board structure in a fourth embodiment of the present invention. FIG. 10A and FIG. 10B are expanded planar schematic diagrams of the first flexible circuit board structure and the second flexible circuit board structure in the fourth embodiment of the present invention. As shown in FIG. 9, the three-dimensional touch device 10B also takes the spherical touch key as an example, but the in-mold formed film is not drawn. As shown in FIG. 10A, the major difference between the first flexible circuit board structure 12C and the first flexible circuit board structure 12 shown in the first embodiment lies in that both sides of the tail end of each of the first bending portions 22 are provided with the snap-fit structures 38B; furthermore, as shown in FIG. 10B, the second flexible circuit board structure 28A includes the second flexible circuit substrate 34A and the second touch electrode 36, wherein the second touch electrode 36 is disposed on the second flexible circuit substrate 34A; the second flexible circuit board structure 28A is formed by bending the second flexible circuit substrate 34A; as shown in FIG. 9, the second flexible circuit board structure 28A and the first flexible circuit board structure 12C are spliced, and the second touch electrode 36 is electrically connected to one or more of the first touch electrodes 18.

As described above, as shown in FIG. 10B, in the fourth embodiment, the unbent second flexible circuit substrate 34A, for example, is stripe-like. A plurality of snap-fit holes 32A are formed in the second flexible circuit substrate 34A. After the first flexible circuit substrate 16C is bent to form the first flexible circuit board structure 12C, the second flexible circuit substrate 34A encircles the outer sides of the tail ends of the plurality of bending portions 22 of the first flexible circuit board structure 12C together, wherein the snap-fit structure 38B at the tail end of each of the bending portions 22 is in snap-fit with the snap-fit hole 32A; thus, the bending and forming effect of the bending portions 22 are reinforced to prevent conditions of inversion or deformation of the bending portions 22 due to flowing of a plastic in the subsequent injection molding process.

Figure 11:
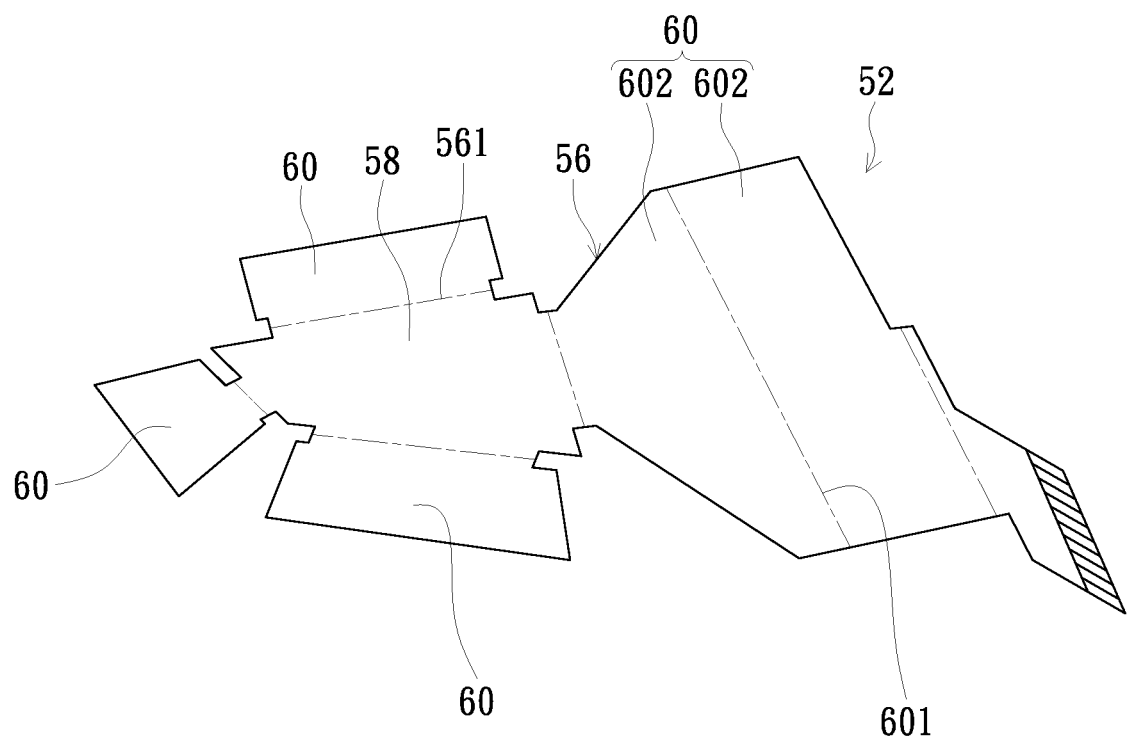
FIG. 11 is a schematic diagram of the three-dimensional touch device in an embodiment of the present invention applied to a touch key of a steering wheel.

In the above embodiment, the three-dimensional touch device which is the spherical touch key is taken as the example, which is not limited thereto. FIG. 11 is a schematic diagram of the three-dimensional touch device in an embodiment of the present invention applied to a touch key of a steering wheel. The first flexible circuit board structure 52 is only drawn. The first flexible circuit board structure 52 is formed by bending the first flexible circuit substrate 56 and is suitable for having the main body portion 58 and a plurality of bending portions 60. Each of the bending portions 60 is connected to the main body portion 58 through the folded line 561. A sub folded line 601 can further be formed on one of the bending portions 60, so as to divide the bending portion 60 into a plurality of sub regions 602. Therefore, it is beneficial for the first flexible circuit board structure 52 to approach to the contour of the exterior film layer when being subsequently put in the mold cavity for injection molding of the exterior film layer, so that the touch key can have the appearance of three-dimensional 3D model, thereby achieving the effects of modeling aesthetics and ergonomics.

Figure 12A:
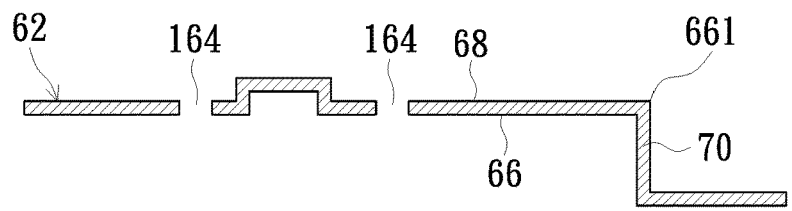
FIGS. 12A-12E show a schematic cross-sectional view of a flow of a manufacturing method of the three-dimensional touch device in an embodiment of the present invention.

FIGS. 12A-12E show a schematic cross-sectional view of a flow of a manufacturing method of the three-dimensional touch device in an embodiment of the present invention. As shown in FIG. 12A, provided is a first flexible circuit board structure 62. The first flexible circuit board structure 62 is formed by bending a first flexible circuit substrate 66 and is suitable for having a main body portion 68 and a bending portion 70. The bending portion 70 is connected to the main body portion 68 through a folded line 661. The different structural patterns, for example, have been uncovered in the above embodiment, which is not repeatedly described herein. Optionally, the through hole 164 is formed in the first flexible circuit substrate. In further an embodiment not drawn, the 3D flexible circuit board structure is formed by splicing two or more flexible circuit board structures according to a complex appearance requirement for a subsequent process.

Figure 12B:
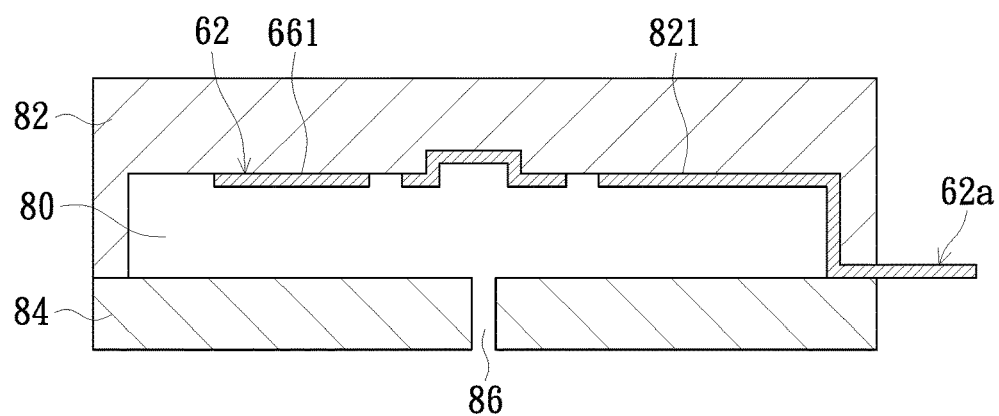
Figure 12C:
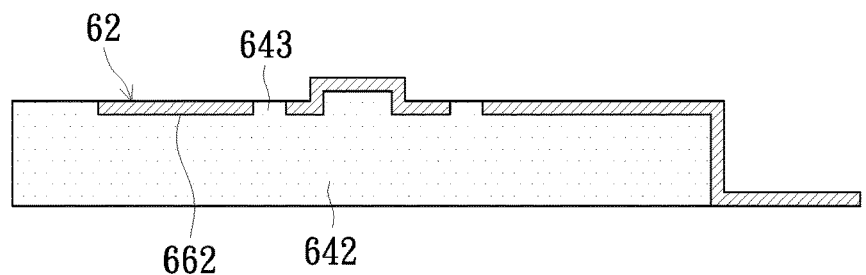

Then, as shown in FIG. 12B, the first flexible circuit board structure 62 is put in a first mold cavity 80 for a first injection process. In an embodiment, the first mold cavity 80 is constructed by a first female mold 82 and a first male mold 84. The first male mold 84 is provided with a first glue inlet 86, wherein the outer surface 661 of the first flexible circuit board structure 62 is attached to the inner side surface 821 of the first female mold 82, and a connecting portion 62a of the first flexible circuit board structure 62 electrically connected to the external electronic device by default is exposed out of the first mold cavity 80. As shown in FIG. 12C, by means of the first injection process, an interior film layer 642 is formed on the inner surface 662 of the first flexible circuit board structure 62. Since a plastic injected from the first glue inlet 86 will flow into the through hole 164, a part of formed interior film layer 642 will fill the through hole 164 as a reinforcing column 643.

Figure 12D:
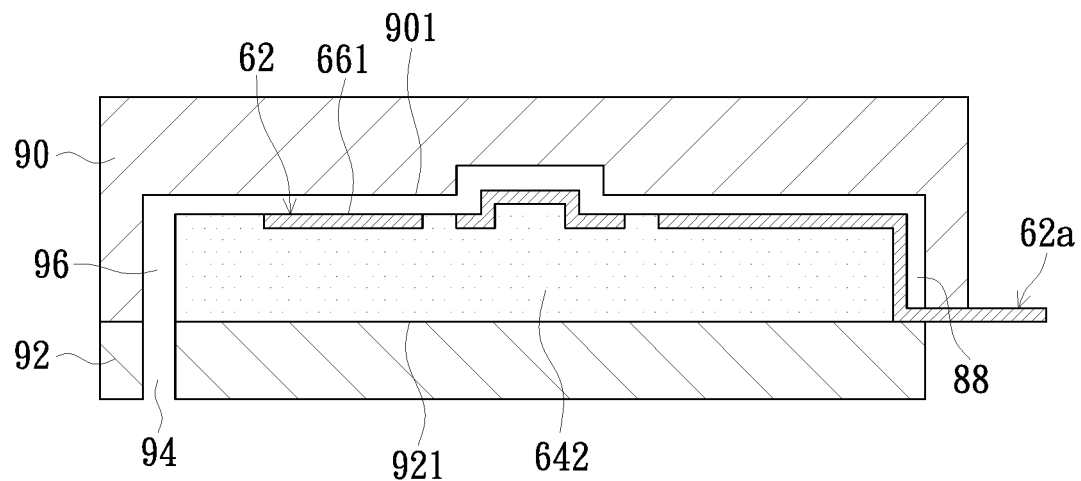
Figure 12E:
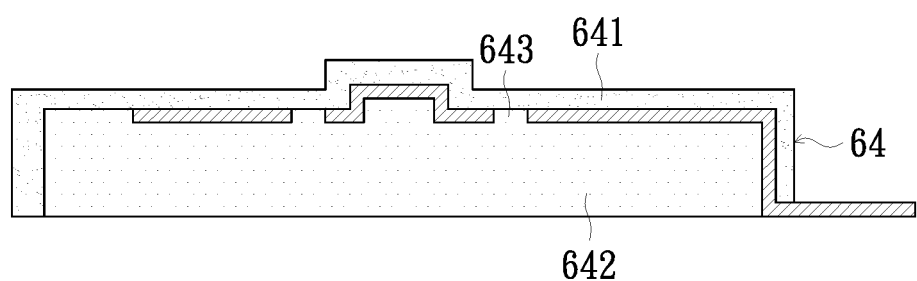

Then, as shown in FIG. 12D, the first flexible circuit structure 62 covered with the interior film layer 642 is put in a second mold cavity 88 for a second injection process. In an embodiment, the second mold cavity 88 is constructed by a second female mold 90 and a second male mold 92, and the second male mold 92 is provided with a second glue inlet 94 for injecting the plastic. During the second injection process, the interior film layer 642 is attached to an inner side surface 921 of the second male mold 92, and the connecting portion 62a of the first flexible circuit board structure 62 electrically connected to the external electronic device by default is exposed out of the second mold cavity 88. A reserved space 96 is formed between the outer surface 661 of the first flexible circuit board structure 62 and an inner side surface 901 of the second female mold 90. The contour of the reserved space 96 corresponds to that of the first flexible circuit board structure 62. The second glue inlet 94 formed in the second male mold 92 is further communicated with the reserved space 96. In the reserved space 96, the spacing between the outer surface 661 of the first flexible circuit board structure 62 and the inner side surface 901 of the second female mold 90 is preferably equal in each position, so that the thickness of the exterior film layer 641 (drawn in FIG. 12E) subsequently formed is uniform, thereby facilitating achievement of the touch function. In an embodiment, a same plastic is used in the first injection process and the second injection process.

As described above, as shown in FIG. 12E, by means of the second injection process, the exterior film layer 641 is formed on the first flexible circuit board structure 62 to cover the outer surface 661 and the first touch electrodes (drawn in FIG. 1) and to be connected to the reinforcing column 643. Therefore, the exterior film layer 641, the interior film layer 642 and the reinforcing column 643 construct the interior formed film 64. The contour of the first flexible circuit substrate 62 approaches to the contour (the first portion of contour) of the exterior film layer 641. Optionally, the 3D flexible circuit board structure is formed by splicing two or more flexible circuit board structures according to the complex appearance requirement for the first and second injection processes, so as to respectively form the interior film layer and the exterior film layer encapsulating the inner surface and the outer surface of the 3D flexible circuit board structure.

In an embodiment, the 3D flexible circuit board structure, for example, is formed by splicing the first flexible circuit board structure with the second flexible circuit board structure in a snap-fit manner, and the contour of the second flexible circuit board structure approaches to the second-part contour of the exterior film layer. Preferably, the manufacturing method of a three-dimensional touch device further includes a welding process of welding the first flexible circuit substrate structure and the second flexible circuit substrate structure spliced together.

As described above, the manufacturing method of the three-dimensional touch device provided in the embodiments of the present invention realizes appearance modeling of the product with the 3D flexible circuit board structure approaching to the curved surface by bending the flexible circuit substrate, and selectively assisted by splicing the plurality of flexible circuit substrates, realizes appearance modeling of the product with the 3D flexible circuit board structure approaching to the curved surface, so that the modeling design is more free and elastic. In the embodiments of the present invention, it is highly difficult to flatly attach the bending portions generated by bending the plurality of non-parallel folded lines in the flexible circuit board structure to the inner side of the shell of the product in a conventional attachment manner. Besides realizing the product appearance of a three-dimensional 3D model to gain the effects of modeling aesthetics and ergonomics by matching the 3D flexible circuit board structure with the in-mold injection molding technique, the manufacturing method of the three-dimensional touch device provided by the embodiment of the present invention enables the three-dimensional touch device to have the better touch sensitivity as the touch electrode can extremely approach to the exterior surface of the product.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A three-dimensional touch device, comprising:
   a first flexible circuit board structure, comprising a first flexible circuit substrate and a plurality of first touch electrodes, wherein the first flexible circuit substrate is provided with an outer surface and an inner surface opposite to each other; the plurality of first touch electrodes are disposed on the outer surface; the first flexible circuit substrate comprises a plurality of folded lines, and at least two of the plurality of folded lines are not parallel to each other; a contour of the first flexible circuit structure is formed by bending the first flexible circuit substrate, and the first flexible circuit substrate is suitable for having a main body portion and a plurality of bending portions; each of the plurality of bending portions is connected to the main body portion through each of the plurality of folded lines; and
   an in-mold formed film, encapsulating the inner surface, the outer surface and the plurality of first touch electrodes, and comprising an exterior film layer covering the outer surface and the plurality of first touch electrodes, wherein the contour of the first flexible circuit structure approaches at least a first-part contour of the exterior film layer.

2. The three-dimensional touch device according to claim 1, wherein at least one through hole is formed in the first flexible circuit substrate; the in-mold formed film further comprises an interior film layer and at least one reinforcing column; the interior film layer covers the inner surface; and the at least one reinforcing column fills the at least one through hole and is connected to the exterior film layer and the interior film layer.

3. The three-dimensional touch device according to claim 1, further comprising a second flexible circuit substrate structure spliced together with the first flexible circuit substrate structure, wherein the contour of the second flexible circuit substrate structure approaches to at least a second-part contour of the exterior film layer.

4. The three-dimensional touch device according to claim 3, wherein the second flexible circuit substrate structure comprises a second flexible circuit substrate and at least one second touch electrode; the at least one second touch electrode is disposed on the second flexible circuit substrate; and the at least one second touch electrode is electrically connected to at least one of the plurality of first touch electrodes.

5. The three-dimensional touch device according to claim 4, wherein the second flexible circuit substrate is spliced with the first flexible circuit substrate in a snap-fit manner.

6. The three-dimensional touch device according to claim 1, wherein the main body portion of the first flexible circuit substrate structure is provided with a plurality of edges, the plurality of bending portions extend respectively from the plurality of edges, and the plurality of edges are respectively taken as the plurality of folded lines.

7. The three-dimensional touch device according to claim 6, wherein the exterior film layer is provided with a curved surface, at least one sub folded line is formed on each of the plurality of bending portions, and each of the plurality of bending portions is bent along the at least one sub folded line to be suitable for approaching to the curved surface.

8. The three-dimensional touch device according to claim 7, being a spherical touch key, wherein the exterior film layer is of a semispherical shell structure provided with a peripheral portion and a top portion; the main body portion faces the top portion in a plate-like manner; the plurality of bending portions are stripe-like; each of the plurality of bending portions is bent along the at least one sub folded line to be divided into at least two sub regions; and the at least two sub regions are suitable for approaching to the peripheral portion.

9. The three-dimensional touch device according to claim 8, wherein the plurality of first touch electrodes are respectively disposed on each of the at least two sub regions and the main body portion.

10. The three-dimensional touch device according to claim 8, further comprising a second flexible circuit substrate structure spliced together with the main body portion, wherein the contour of the second flexible circuit substrate structure approaches to the contour of the top portion.

11. The three-dimensional touch device according to claim 10, wherein the second flexible circuit substrate structure comprises a second flexible circuit substrate and at least one second touch electrode; the at least one second touch electrode is disposed on the second flexible circuit substrate; the second flexible circuit substrate is bent in a conical shape; and a bottom edge of the conical shape is spliced to the main body portion.

12. The three-dimensional touch device according to claim 11, wherein an open slot and a plurality of snap-fit holes are formed in the main body portion, and the second flexible circuit substrate is provided with a plurality of snap-fit structures suitable for being fastened with the snap-fit holes, respectively.

13. A manufacturing method of a three-dimensional touch device, comprising:
   providing a first flexible circuit board structure, comprising a first flexible circuit substrate and a plurality of first touch electrodes, wherein the first flexible circuit substrate is provided with an outer surface and an inner surface opposite to each other; the plurality of first touch electrodes are disposed on the outer surface; the first flexible circuit substrate comprises a plurality of folded lines, and at least two of the plurality of folded lines are not parallel to each other; a contour of the first flexible circuit structure is formed by bending the first flexible circuit substrate, and the first flexible circuit substrate is suitable for having a main body portion and a plurality of bending portions; each of the plurality of bending portions is connected to the main body portion through each of the plurality of folded lines;
   placing the first flexible circuit board structure in a first mold cavity for a first injection process to form an interior film layer covering the inner surface; and
   placing the first flexible circuit board structure covered by the interior film layer in a second mold cavity for a second injection progress to form an exterior film layer covering the outer surface and the plurality of first touch electrodes, wherein the contour of the first flexible circuit structure approaches to at least a first-part contour of the exterior film layer.

14. The manufacturing method of a three-dimensional touch device according to claim 13, wherein at least one through hole is formed in the first flexible circuit substrate, and during the first injection process, a part of the interior film layer fills the at least one through hole as at least one reinforcing column.

15. The manufacturing method of a three-dimensional touch device according to claim 14, wherein the exterior film layer is connected to the at least one reinforcing column.

16. The manufacturing method of a three-dimensional touch device according to claim 13, further comprising: providing a second flexible circuit substrate structure and splicing the second flexible circuit substrate structure together with the first flexible circuit substrate structure in a snap-fit manner, wherein the contour of the second flexible circuit substrate structure approaches to at least a second-part contour of the exterior film layer.

17. The manufacturing method of a three-dimensional touch device according to claim 16, further comprising a welding process of welding the first flexible circuit substrate structure and the second flexible circuit substrate structure spliced together.

18. The manufacturing method of a three-dimensional touch device according to claim 13, wherein the main body portion of the first flexible circuit substrate structure is provided with a plurality of edges, the plurality of bending portions extend respectively from the plurality of edges, and the plurality of edges are respectively taken as the plurality of folded lines.

19. The manufacturing method of a three-dimensional touch device according to claim 18, wherein the exterior film layer is provided with a curved surface, at least one sub folded line is formed on each of the plurality of bending portions, and each of the plurality of bending portions is bent along the at least one sub folded line to be suitable for approaching to the curved surface.

20. The manufacturing method of a three-dimensional touch device according to claim 13, wherein a same plastic is used in the first injection process and the second injection process.

* * * * *